United States Patent
Tan et al.

(10) Patent No.: US 7,589,556 B1
(45) Date of Patent: Sep. 15, 2009

(54) DYNAMIC CONTROL OF MEMORY INTERFACE TIMING

(75) Inventors: Johnson Tan, Mountain View, CA (US); Andrew Bellis, Guildford (GB); Philip Clarke, Leatherhead (GB); Yan Chong, San Jose, CA (US); Joseph Huang, Morgan Hill, CA (US); Michael H. M. Chu, Fremont, CA (US); Chiakang Sung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 3 days.

(21) Appl. No.: 11/925,717

(22) Filed: Oct. 26, 2007

(51) Int. Cl.
*G06F 7/38* (2006.01)
(52) U.S. Cl. .................... 326/40; 326/46; 326/38
(58) Field of Classification Search ............ 326/40, 326/46, 38; 327/158, 159, 161; 375/376, 375/156
See application file for complete search history.

(56) References Cited

U.S. PATENT DOCUMENTS

| 4,637,018 | A  | * | 1/1987 | Flora et al. ............... 714/700 |
| 7,072,433 | B2 | * | 7/2006 | Bell ..................... 375/376 |
| 7,242,229 | B1 | * | 7/2007 | Starr et al. ............... 327/156 |

\* cited by examiner

*Primary Examiner*—Daniel D Chang
(74) *Attorney, Agent, or Firm*—Townsend and Townsend and Crew LLP (57) ABSTRACT

Circuits, methods, and apparatus for the dynamic control of calibration data that adjusts the timing of input and output signals on an integrated circuit. This dynamic control allows input and output circuits to self-calibrate by compensating for temperature and voltage changes in an efficient manner, without the need for device reconfiguration. Calibration settings can be maintained while new calibration settings are loaded. Skew between clock and data signals, as well as among multiple data signals, can be reduced. Dynamic control is achieved while consuming only a minimal resources including route paths.

27 Claims, 8 Drawing Sheets

DYNAMIC CONTROL OF MEMORY INTERFACE TIMING

BACKGROUND

Embodiments of the present invention relate generally to the control of delay lines, and more particularly to the highly efficient calibration of programmable delay lines. Programmable delay lines are very important in programmable logic devices and other configurable devices. The delays they provide can be varied to compensate for skew among various signal paths to aid in the accurate reception and transmission of data. That is, their delays can be adjusted to compensate for errors such as mismatches in delays among two or more signal paths.

Many types of programmable delay lines may be employed by programmable logic devices or other configurable devices. Their delays may be adjusted by setting bits in a digital word of some length, where the bits control multiplexers, current sources, or other circuits.

Modern programmable logic devices and other configurable circuits incorporate many such programmable delay lines. For example, each input and output circuit may have one such programmable delay line associated with it. Since there are so many programmable delay lines, it is very desirable to efficiently be able to program them. For example, the routing resources on a programmable logic device are limited in number. Thus, it is desirable that many delay lines be programmable without consuming an excessive amount of these resources.

These programmable delay lines often need to be adjusted during device operation. For example, device temperature or supply voltage may change. This may result in changes in the delays provided by the delay elements. Thus, it is desirable to be able to recalibrate or otherwise adjust these delay lines during device operation without needing to reconfigure or cease operation of the programmable delay element.

Thus, what is needed are circuits, methods, and apparatus that provide the highly efficient configuration of multiple delay elements. It is also desirable that the delay elements be updated simultaneously without the need to reset or halt operation of a device or system that includes the delay elements.

SUMMARY

Accordingly, embodiments of the present invention provide circuits, methods, and apparatus for the dynamic control of calibration data that adjusts the timing of input and output signals on an integrated circuit to reduce skew between clock and data signals. This dynamic control allows inputs and outputs to self-calibrate to an optimal setting by compensating for temperature and voltage changes in an efficient manner, without the need for device reconfiguration. Calibration settings can be maintained while new calibration settings are loaded. Skew between clock and data signals, as well as among multiple data signals, can be reduced. Dynamic control is achieved while consuming only a minimal amount of resources such as route paths.

An exemplary embodiment of the present invention provides a dynamic control of input and output signal timing by incorporating a dynamic control circuit. The dynamic control circuit can receive new control signal data during device operation, thus allowing self-calibration of input and output signals to compensate for temperature and voltage changes. This is achieved without the need to reconfigure the device. The dynamic control circuit preserves routing resources. For example, a specific embodiment uses only uses four input signal lines. Control signal data is received by a shift register on a first one of these lines. This data is shifted in using a clock signal, and the shifting is enabled with an enable signal. When the control signal data has been shifted into the shift register, it is transferred to a second set of registers following an active update signal. The second set of registers receives control data from the shift register, stores it, and provides it to the programmable delay lines. Data in the shift register can be updated while current data is held in the second set of registers, thus speeding the calibration process. Data can be read back from the shift register for verification purposes. The control data can be used to adjust and deskew the timing between clock and data signals, as well as among multiple data signals.

Another exemplary embodiment of the present invention provides a dynamic control circuit that speeds the calibration process by allowing new control data to be loaded while current control data is held and used by one or more delay lines. This is accomplished by including a holding register along with an input shift register. The shift register includes a number of flip-flops, each having a multiplexer at its input. One input of the multiplexer for a first flip-flop is coupled to receive calibration data. Multiplexers for subsequent flip-flops have an input coupled to an output of their previous flip-flop. A second input for each multiplexer receives an output from its flip-flop. When the shift register is being loaded, the first inputs of each of the multiplexers are selected using an enable signal. When the shift register is being held, the second inputs of each of the multiplexers are selected. The holding register also includes a number of flip-flops, each having an input multiplexer as well. When the holding flip-flops are being updated, a multiplexer input connected to an output of a corresponding one of the shift register flip-flops is selected. When they are holding data, a multiplexer input connected to an output of its flip-flop is selected.

Various embodiments of the present invention may incorporate one or more of these or the other features described herein. While embodiments of the present invention are well-suited to calibrating programmable delay lines, other programmable circuits can be calibrated or configured using embodiments of the present invention. A better understanding of the nature and advantages of the present invention may be gained with reference to the following detailed description and the accompanying drawings.

DESCRIPTION OF EXEMPLARY EMBODIMENTS

Figure 1:
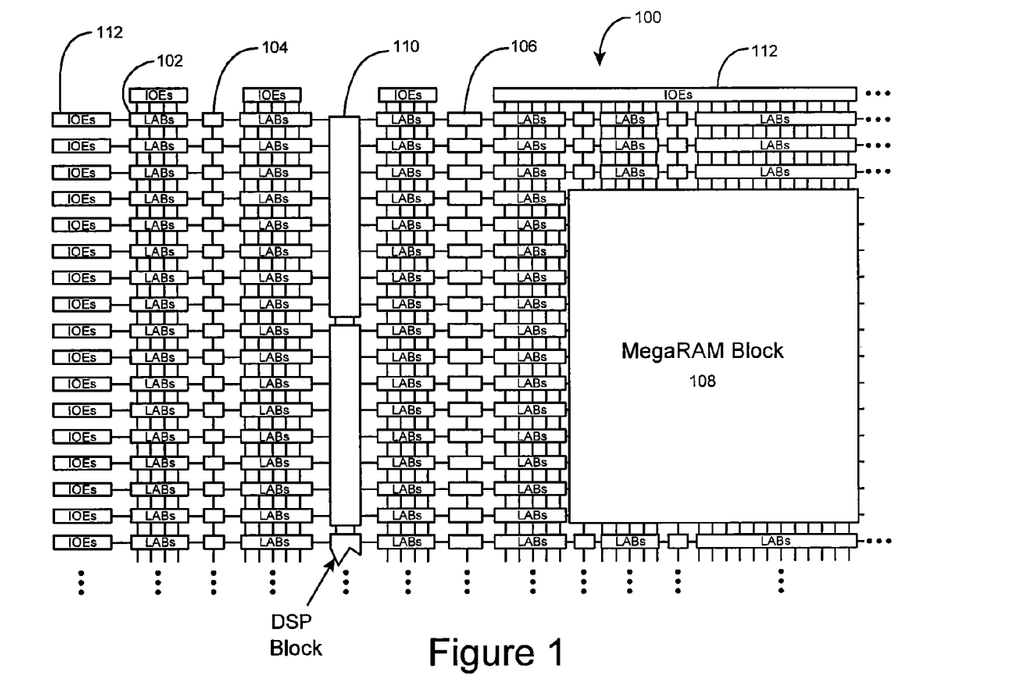
FIG. 1 is a simplified block diagram of a programmable logic device that is improved by incorporating embodiments of the present invention.

FIG. 1 is a simplified partial block diagram of an exemplary high-density programmable logic device or FPGA 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4 K blocks 106, and an M-Block 108 providing 512 bits of RAM. These memory blocks may also include shift registers and FIFO buffers. PLD 100 further includes digital signal processing (DSP) blocks 110 that can implement, for example, multipliers with addition or subtraction features.

It is to be understood that PLD 100 is described herein for illustrative purposes only and that the present invention can be implemented in many different types of PLDs, FPGAs, and the other types of digital integrated circuits.

While PLDs or FPGAs of the type shown in FIG. 1 provide many of the resources required to implement system level solutions, the present invention can also benefit systems wherein a PLD is one of several components.

Figure 2:
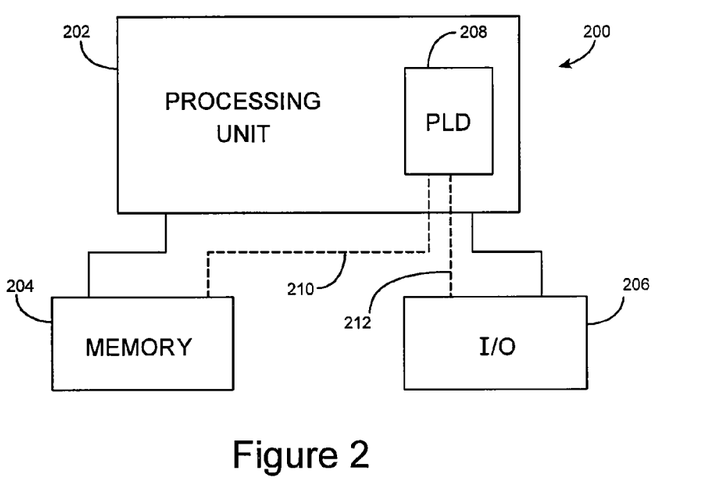
FIG. 2 is a block diagram of an electronic system that is improved by incorporating embodiments of the present invention.

FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications, such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an input/output unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to input/output unit 206 through connection 212.

Processing unit 202 may direct data to an appropriate system component for processing or storage, execute a program stored in memory 204, or receive and transmit data via input/output unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments there is often no need for a CPU.

For example, instead of a CPU, one or more PLDs 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC card flash disk memory, tape, or any other storage means, or any combination of these storage means.

Figure 3:
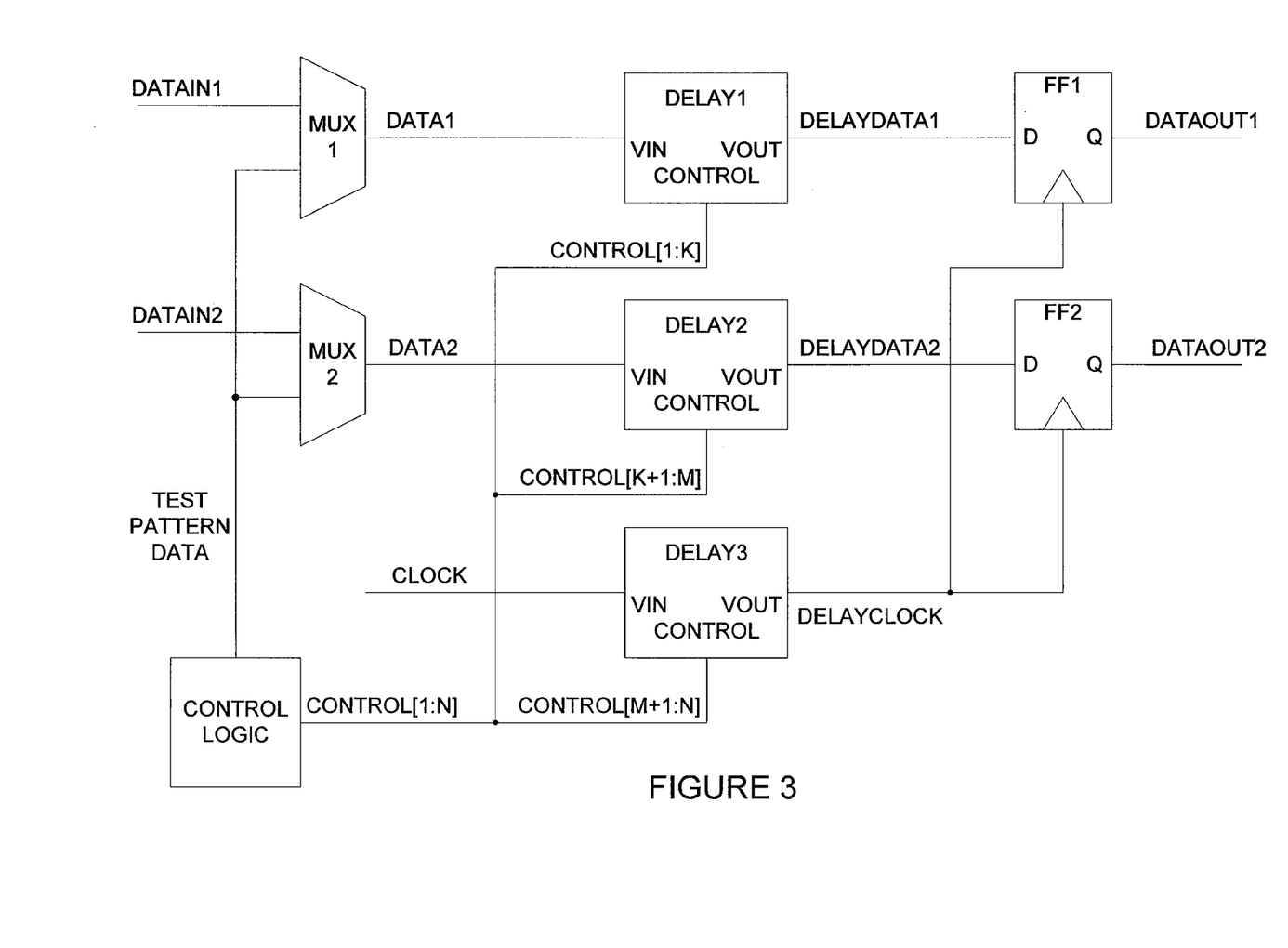
FIG. 3 is a block diagram of an interface circuit that incorporates an embodiment of the present invention.

FIG. 3 is a block diagram of an interface circuit that incorporates an embodiment of the present invention. This block diagram includes input capture flip-flops FF1 and FF2, delay lines DELAY1, DELAY2, and DELAY3, input multiplexers MUX1 and MUX2, and a control logic circuit. This figure, as with the other included figures, is shown for illustrative purposes and does not limit either the possible embodiments of the present invention or the claims.

Data is received from data pins or other circuitry on data input lines DATAIN1 and DATAIN2 by multiplexers MUX1 and MUX2. The multiplexers provide inputs to delay lines DELAY1 and DELAY2. A clock signal, for example a clock signal generated by a phase-locked loop or delay-locked loop, is delayed by DELAY3. The outputs of DELAY1 and DELAY2 are registered or captured by flip-flops FF1 and FF2, which are clocked by the output of DELAY3.

The delays provided by DELAY1, DELAY2, and DELAY3 are set by control data signals CONTROL[1:N]. During calibration, the delays provided by the delay lines may be swept over a range and the optimum settings determined. This optimum setting can then be used to receive data at the DATAIN1 and DATAIN2 lines.

Specifically, during a calibration mode, a first set of control data signals CONTROL[1:N] is provided by the control logic. Test pattern data can also be generated and provided to either or both the multiplexers MUX1 and MUX2 on the DATAIN1 and DATAIN2 lines. Multiplexers MUX1 and MUX2 select the test pattern data and provide it to delay lines DELAY1 and DELAY2. The clock is similarly delayed by DELAY3. The outputs of DELAY1 and DELAY2 are retimed or captured by flip-flops FF1 and FF2, which are clocked by the output of DELAY3. The captured data can be compared to expected data and from this, the delay lines calibrated. Exemplary algorithms that may be used to calibrate these signals are shown below. These algorithms may be employed during device operation to deskew the data and clock signals without the need to reconfigure the device.

In this block diagram, inputs for two data signals are shown. In other embodiments of the present invention, less than two or more than two inputs may be calibrated. In this embodiment, the data lines may be independently adjusted to deskew the input data signals received at data DATAIN1 and DATAIN2.

In other embodiments of the present invention, output signals may be deskewed, or both input and output signals may be deskewed. For example, delay lines may be inserted at the outputs of flip-flops that are coupled to output pads. The delays provided by these delay lines may be used to deskew output signals such that they are simultaneously (or near simultaneously) received by a receiving device.

Figure 4:
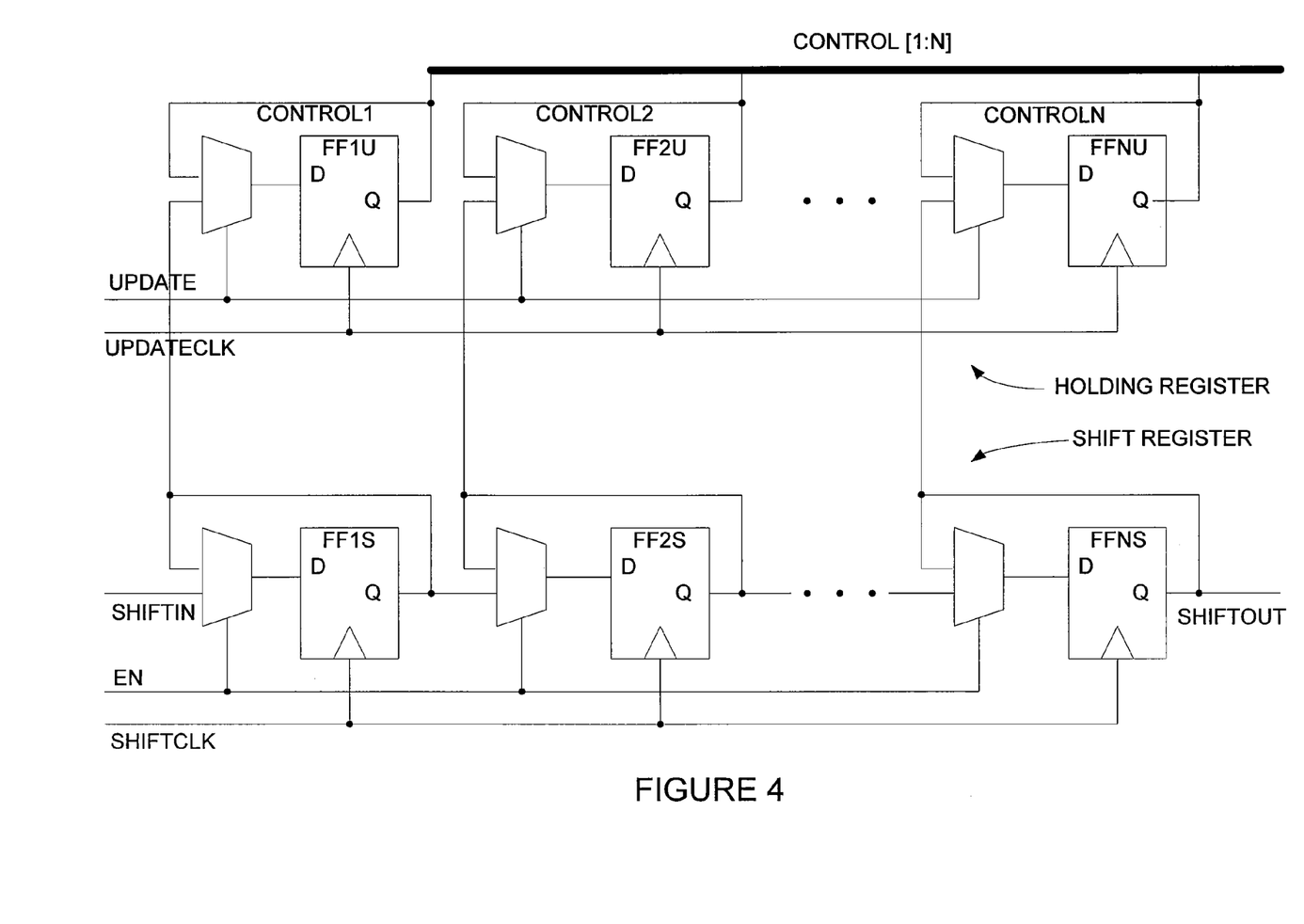
FIG. 4 is a schematic of a dynamic control circuit consistent with an embodiment of the present invention.

Since many control settings may be used during a calibration routine, it is desirable to be able to dynamically swap-in or replace control data. Accordingly, an exemplary embodiment of the present invention employs a dynamic control circuit to provide this control data. An example of such a dynamic control circuit is shown in the following figure.

FIG. 4 is a schematic of a dynamic control circuit consistent with an embodiment of the present invention. The dynamic control circuit includes a shift register comprising a number of flip-flops FF1S, and FF2S through FFNS, and a holding register that includes a number of flip-flops FFU1, and FFU2 through FFNU. The flip-flops of the shift register are coupled in series, each having a multiplexer coupled to its input. The inputs of these multiplexers can be selected to receive data serially, or to hold data. When receiving data, the enable signal EN in this example is high, and the data at the SHIFTIN input is clocked through the flip-flops of the shift register. The shift register itself is clocked by a SHIFTCLK signal.

When the shift register has completed receiving data, the enable signal EN is deasserted, and the multiplexers at the inputs of the shift register flip-flops select the outputs of their respective flip-flops. This holds the data in the shift register. When the control data is to be updated, the UPDATE signal is asserted, and data is transferred from the shift register to the holding register on the next rising edge of UPDATECLK. The holding register also has multiplexers connected to the inputs of its flip-flops. When data is transferred, a first input is selected for each of these holding register multiplexers. When data is to be held in the holding registers, the update signal is deasserted and the multiplexers select a second input, which is connected to the outputs of their respective flip-flops.

This configuration allows for the updating of the control data using a minimum amount of routing resources. Also, in this example, the clock signal UPDATECLK for the holding registers is shown as a different signal than the shift register clock signal SHIFTCLK, though in other embodiments of the present invention, these clock signals may be the same. In such a configuration, only SHIFTIN, EN, SHIFTCLK, and UPDATE signals are needed. A SHIFTOUT signal that provides control data to another shift register or for verification purposes may also be included. In an exemplary embodiment of the present invention, the dynamic control circuit resides on a field programmable gate array, where the SHIFTIN, EN, SHIFTCLK, and UPDATE signals are provided by core circuitry.

Figure 5:
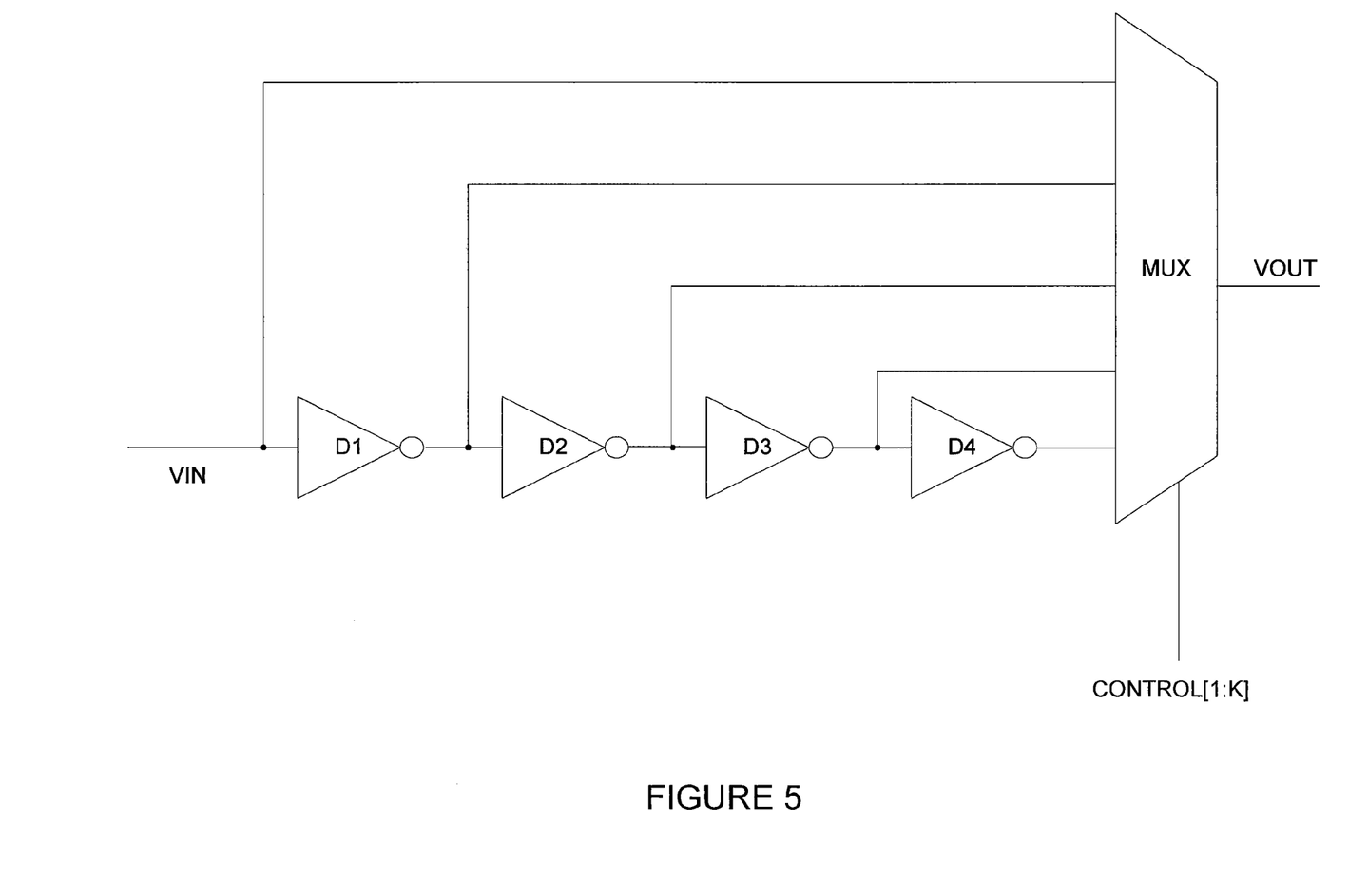
FIG. 5 is a schematic of a delay line or portion of a delay line that may be incorporated in embodiment of the present invention.

This configuration allows control data in the shift register to be updated while current control data is held in the holding register. Current data can be held for a calibration routine, while new data it is shifted into the shift register. The control data may adjust the delays provided by delay lines in a number of ways. For example, the control data may select inputs of multiplexers, or it may adjust current sources which charge or discharge capacitors. Other configurations are possible as well. An exemplary delay line is shown in the following figure.

FIG. 5 is a schematic of a delay line or portion of a delay line that may be incorporated in an embodiment of the present invention. This delay line includes a number of delay elements D1, D2, D3, and D4, each having an output coupled to an input of a multiplexer. The input signal VIN is also coupled to the multiplexer in this example. A number of control signals select one of the inputs of the multiplexers to be provided as VOUT. The delay provided by this delay line may be increased by selecting outputs of later delay elements, while the delay may be decreased by selecting outputs of earlier delay elements. The delay line can be nominally set to zero by selecting the input signal VIN, though a residual gate delay through the multiplexer will remain.

In this or other embodiments of the present invention, several such delay lines can be grouped together. In such circuits, the outputs of the multiplexers may be further selected by one or more other multiplexers to provide an output of the delay line. Further, the delays provided by one or more of the delay elements, D1, D2, D3, and D4, may be adjusted using these or other control signals.

Figure 6A:
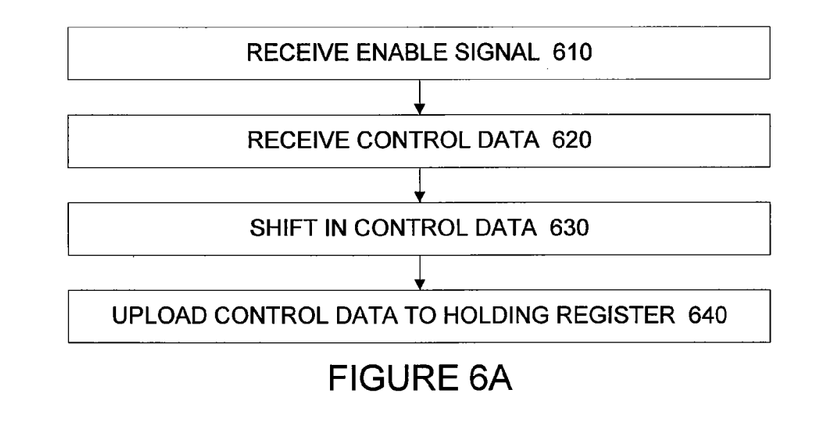
FIGS. 6A and 6B are flowcharts illustrating the operation of a dynamic control circuit according to an embodiment of the present invention.
Figure 6B:
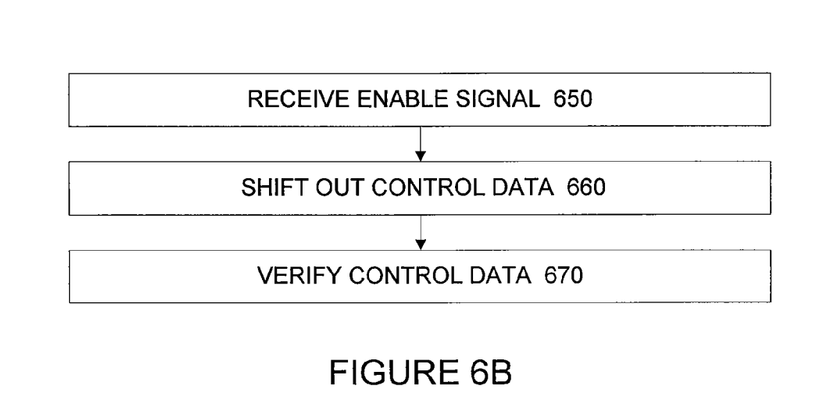

Again, embodiments of the present invention provide the rapid updating of control data by including two sets of flip-flops, where a first set is coupled as a shift register to read data and a second set is coupled as a holding register to store data while new data is shifted into the shift register. The data can also be read back out on the shift register for verification purposes. Flowcharts showing these operations follow.

FIGS. 6A and 6B are flowcharts illustrating the operation of a dynamic control circuit according to an embodiment of the present invention. FIG. 6A illustrates a method of providing control data to a plurality of delay lines. In act 610, a dynamic control circuit receives an enable signal. The control data is received in act 620. In act 630, it is shifted into a shift register in the dynamic control circuit. In act 640, the control data is uploaded to an update or holding register in the dynamic control circuit. While the control data is held in the holding register, new data can be shifted into the shift register.

Figure 7:
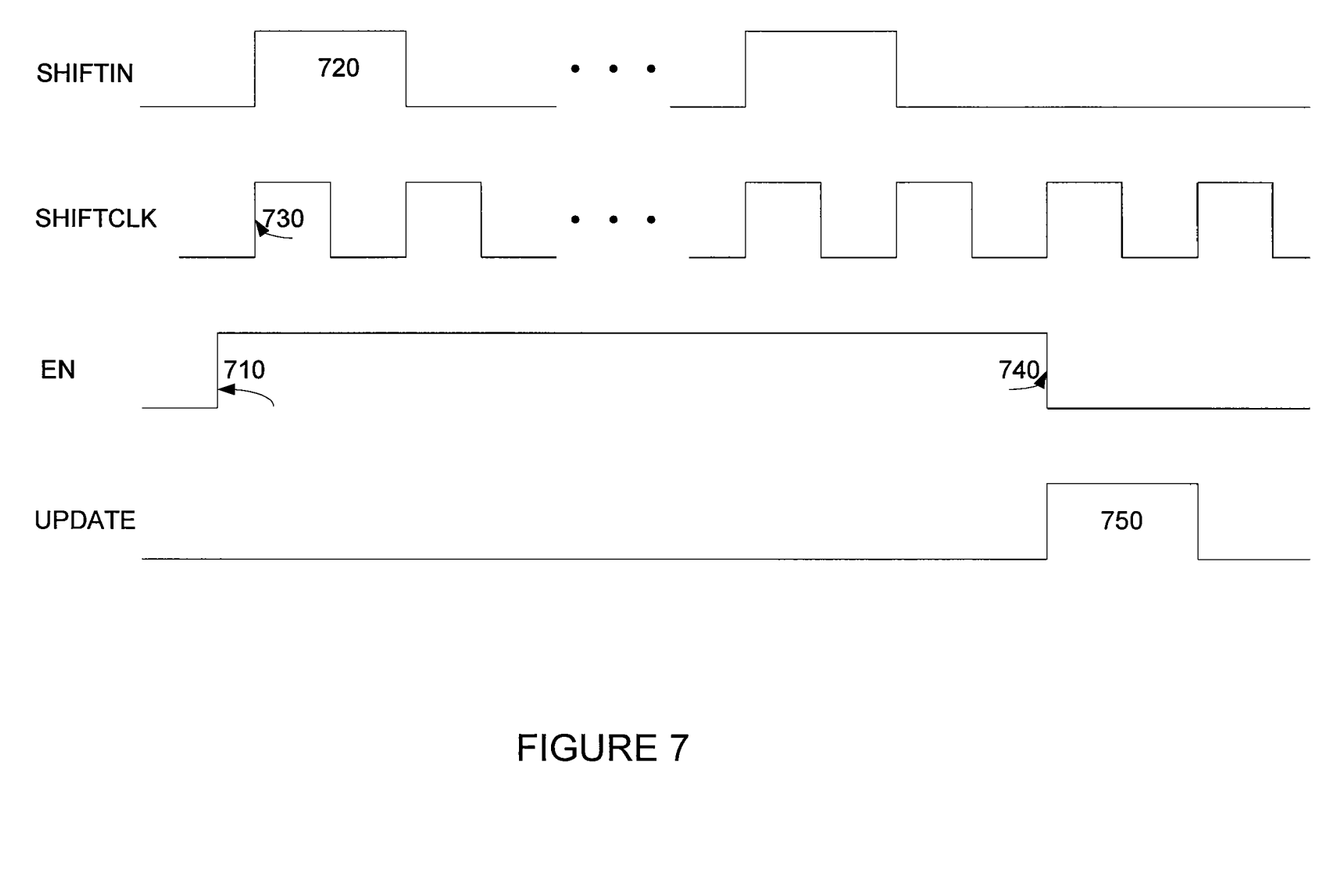
FIG. 7 is a timing diagram for a dynamic control circuit according to an embodiment of the present invention.

FIG. 6B is a flowchart illustrating control data verification of a dynamic control circuit according to an embodiment of the present invention. An enable signal is received in act 650. In act 660, the control data is shifted out of the shift register. In act 670, the control data is verified. The timing of the signals used for the circuit of FIG. 3 and these flowcharts is shown in the following figure.

FIG. 7 is a timing diagram for a dynamic control circuit according to an embodiment of the present invention. Again, the dynamic control circuit only needs four signals to operate, namely SHIFTIN, SHIFTCLK, EN, and UPDATE, though in other configurations the holding register may have a separate clock. The SHIFTIN signal comprises a number of data pulses 720. The SHIFTCLK signal clocks data into the shift registers on rising edges 730, though in other embodiments of the present invention the shift register may be active on falling edges, or both edges, of the clock. The enable signal is asserted at time 710 and deasserted when the shift register is loaded at time 740. After the shift register is loaded, the update signal 750 is asserted, thereby transferring the data from the shift register to a holding register. While the enable signal is high and new data is shifted into the shift register, previous data in the holding register may be used, for example, for a calibration procedure.

Figure 8:
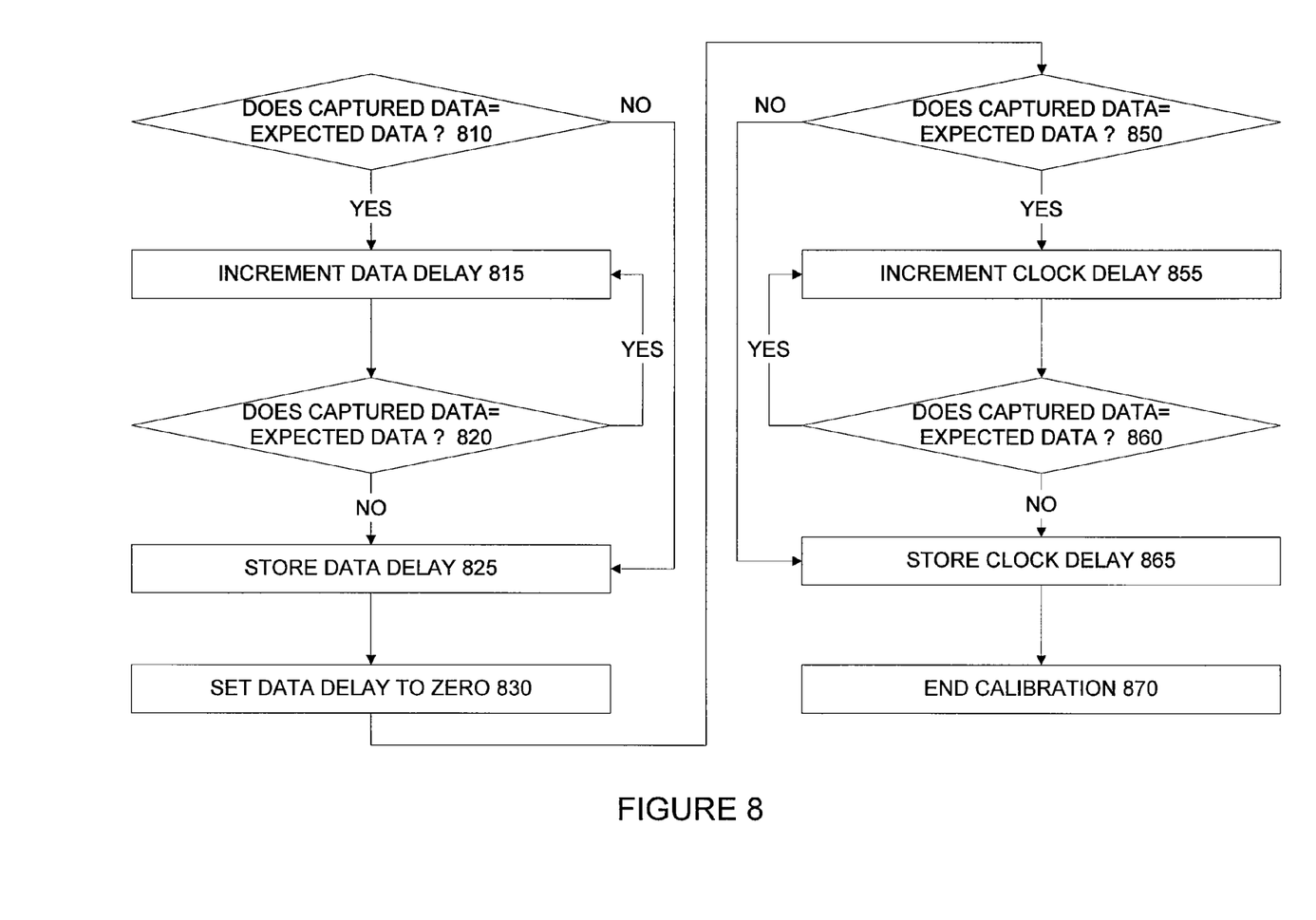
FIG. 8 is a flowchart illustrating a method of deskewing signals that is improved by incorporating an embodiment of the present invention.

Again, the control data may be changed during a calibration routine that is used to deskew input or output signals. An example illustrating a calibration routine used to deskew input signals is shown in the following figure.

FIG. 8 is a flowchart illustrating a method of deskewing signals that is improved by incorporating an embodiment of the present invention. In this method, data is delayed relative to a clock signal to determine how far the start of a data bit leads an active edge of the clock signal. Once this is complete, the clock signal is delayed relative to the data signal to determine how far the end of the data bit lags the active edge of clock. Once the position of the clock relative to the start and end of the data bit is known, the delays can be adjusted for improved data reception. This routine may be performed at device start-up, or at other times to compensate for changes in device temperature and operating voltage.

Specifically, in act 810, with the delays set at zero, it is determined whether the captured data is the same as the expected data. If it is not, then the data delay of zero is stored in act 825. If the captured data equals expected data, then the data delay is incremented in act 815. In act 820, it is determined again whether the captured data equals the expected data. If it does not, the delay is stored in act 825. If it does, the delay is again incremented in act 815. At some point, the start of the data bits will be delayed beyond the clock active edge, and the expected data will not be captured.

Once the data delay is stored in act 825, the data delay is set to zero in act 830. Again, it is determined whether the captured data equals the expected data in act 850. If it does not, then the clock delay is stored in act 865. If it does match, the clock delay is incremented in act 855. Again, in act 860, it is determined whether the captured data equals the expected data. If it does not, the clock delay is stored in act 865. If it does, the clock delay is incremented again in act 855. Again, at some point the clock will be delayed beyond the end of the data bits such that the expected data is not captured. Once the clock delay is stored in act 865, this part of the calibration routine is ended in act 870.

Each time the clock delay or data delays are incremented, the data is checked to determine whether the captured data is the same as the expected data. The delays are incremented and the capture data checked again. Accordingly, it is desirable to be able to swap or replace delay control data quickly. This makes the shift register and holding register configuration of the present invention particularly useful, since the shift register can be loaded with the next control signal while the current control signal is stored in the holding register for use by one or more delay lines.

Figure 9:
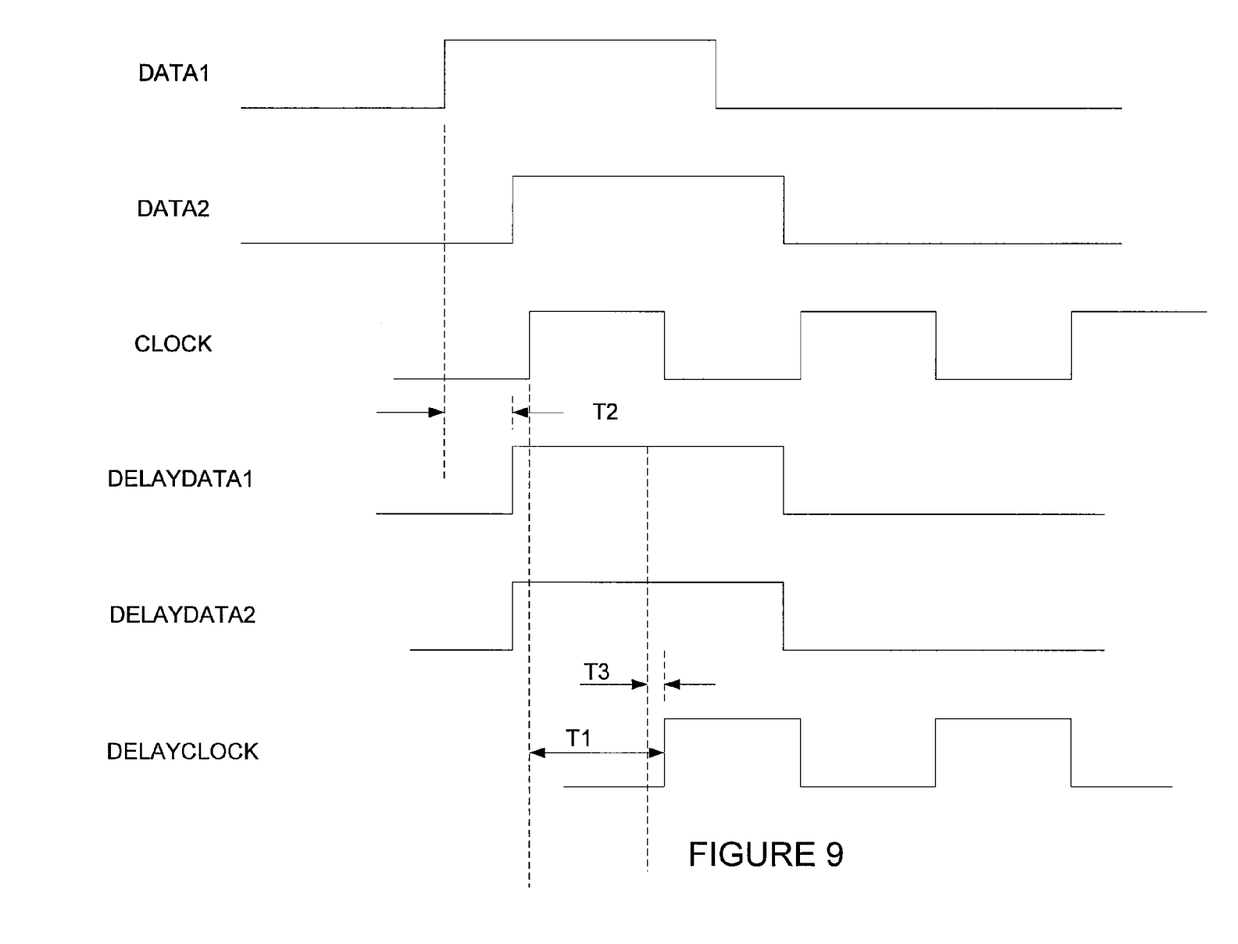
FIG. 9 is a timing diagram of the signals in FIG. 3 after a calibration routine has been completed.

Again, in one embodiment of the present invention, the data signals are delayed to determine the relationship between the start of a data bit and a clock rising edge. The clock signal is then delayed to determine the relationship between a clock rising edge and the end of the data period. In other embodiments of the present invention, the falling clock edges may be the active edge. Where multiple data signals are calibrated, each data signal can be delayed relative to the clock, and the most skewed data signal determined. To save time, the clock can then be delayed and only the most skewed data signal captured. The clock and other data signals are then delayed relative to the most skewed data signal. A timing diagram illustrating the end result of this calibration routine is shown in the following figure.

FIG. 9 is a timing diagram of the signals in FIG. 3 after calibration. This figure includes data input signals DATA1 and DATA2, a clock signal CLOCK, delayed versions of the data signals DELAYDATA1 and DELAYDATA2, and a delayed clock signal DELAYCLOCK. In this example, the clock is delayed an amount T1 to center rising edges of the clock signal in the middle of data bits of the most skewed (that is, delayed by skew) data signal, which in this example is DATA2. The most delayed data signal is not delayed, while the other signal DATA1 is delayed an amount T2 such that it is aligned with DATA2.

After calibration, the DELAY1 element provides a delay of T2 to the DATA1 signal to generate DELAYDATA1. No delay is provided to the DATA2 signal, that is, the delay through delay line DELAY2 is set to zero. In practical circuits, a residual delay of one or more gate delays does remain when a delay through a delay line is set to zero. The clock is delayed an amount T1 to generate DELAYCLOCK. Since the delay lines do not have an infinite resolution, there will be a residual error T3, which may be referred to as a quantization error.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
 a plurality of interface circuits;
 a plurality of programmable delay lines associated with the plurality of interface circuits; and
 a dynamic control circuit for setting delays provided by each of the plurality of programmable delay lines, the dynamic control circuit comprising:
  a first plurality of flip-flops; and
  a holding register to receive control data from the first plurality of flip-flops and to store control data for the plurality of programmable delay lines,
 wherein each of the first plurality of flip-flops is coupled to a multiplexer, each multiplexer having a first input coupled to receive an output from its flip-flop, and wherein the multiplexer for the first flip-flop has a second input coupled to receive control data, and the multiplexers for the other flip-flops have a second input coupled to receive an output from a previous flip-flop.

2. The integrated circuit of claim 1 wherein the holding register comprises a second plurality of flip-flops, each flip-flop in the first plurality of flip-flops having an output coupled to a flip-flop in the holding register.

3. The integrated circuit of claim 1 wherein the interface circuits include input circuits.

4. The integrated circuit of claim 1 wherein the interface circuits include output circuits.

5. The integrated circuit of claim 1 wherein the first plurality of flip-flops includes an output to provide the control data.

6. An integrated circuit comprising:
 a plurality of interface circuits;
 a plurality of programmable delay lines associated with the plurality of interface circuits;
 a control logic circuit to provide control data during a calibration routine; and
 a dynamic control circuit to provide the control data to adjust delays provided by each of the plurality of programmable delay lines, the dynamic control circuit comprising:
  a shift register having an input coupled to receive control data from the control logic circuit; and
  a holding register to receive the control data from the shift register and to store the control data for the plurality of programmable delay lines,
 wherein during the calibration routine, while the holding register holds a first set of control data, the shift register receives a second set of control data.

7. The integrated circuit of claim 6 wherein the shift register comprises a first plurality of flip-flops coupled in series and the holding register comprises a second plurality of flip-flops, each flip-flop in the shift register having an output coupled to a flip-flop in the holding register.

8. The integrated circuit of claim 7 wherein each of the first plurality of flip-flops in the shift register is coupled to a multiplexer, each multiplexer having a first input coupled to receive an output from its flip-flop, and wherein the multiplexer for the first flip-flop has a second input coupled to receive the control data, and the multiplexers for the other flip-flops have a second input coupled to receive an output from a previous flip-flop.

9. The integrated circuit of claim 6 wherein the interface circuits include input circuits.

10. The integrated circuit of claim 6 wherein the interface circuits include output circuits.

11. The integrated circuit of claim 6 wherein the shift register further comprises an output to provide the control data.

12. A method of controlling a plurality of programmable delay lines comprising:
receiving a first set of control data serially with a shift register;
transferring the first set of control data from the shift register to a holding register;
holding the first set of control data using the holding register;
delaying a first test pattern signal a first delay dependent on a first portion of the first set of control data;
delaying a clock signal a second delay dependent on a second portion of the first set of control data;
generating a first calibration result using the first delay and the second delay;
while generating the first calibration result, receiving a second set of control data with the shift register;
transferring the second set of control data from the shift register to the holding register;
holding the second set of control data using the holding register;
delaying the first test pattern signal a third delay dependent on a first portion of the second set of control data;
delaying the clock signal a fourth delay dependent on a second portion of the second set of control data; and
generating a second calibration result using the third delay and the fourth delay.

13. The method of claim 12 further comprising:
determining a fifth delay based on the first calibration result and the second calibration result.

14. The method of claim 13 wherein the fifth delay may be equal to the first delay or the third delay.

15. The method of claim 13 wherein the fifth delay is not equal to either the first or the third delay.

16. The method of claim 13 further comprising:
receiving a first data signal; and
delaying the first data signal the fifth delay.

17. The method of claim 12 wherein receiving the first set of control data with the shift register comprises shifting the control data through a series of flip-flops.

18. The method of claim 17 wherein transferring the first set of control data to the holding register comprises selecting a first multiplexer input on each of a plurality of multiplexers, each coupled to an input of a flip-flop in the holding register, the first multiplexer input coupled to one of the series of flip-flops in the shift register.

19. The method of claim 18 wherein holding the first set of control data using the holding register comprises selecting a second multiplexer input on each of the plurality of multiplexers.

20. A method of controlling a plurality of programmable delay lines comprising
during a calibration routine:
receiving a test pattern;
delaying the test pattern a first delay using a delay line, the first delay of the delay line determined by a first control data stored in a holding register;
receiving a second control data using a shift register;
replacing the first control data stored in the holding register by transferring the second control data from the shift register to the holding register; and
delaying the test pattern a second delay using the delay line, the second delay of the delay line determined by the second control data stored in the holding register.

21. The method of claim 20 wherein the delay line comprises a plurality of delay elements, each having an output coupled to a multiplexer, wherein a select input for the multiplexer is coupled to one or more flip-flops in the holding register.

22. The method of claim 20 wherein transferring the second control data from the shift register to the holding register comprises:
using a plurality of flip-flops in the shift register to provide the second control data to a corresponding plurality of multiplexers in the holding register; and
storing the second control data at the multiplexers in the holding register in a corresponding plurality of flip-flops in the holding register.

23. An integrated circuit comprising:
a first data path comprising a first multiplexer to select between a first data input and a test pattern, wherein the test pattern is selected during a calibration routine;
a second data path comprising a second multiplexer to select between a second data input and a test pattern, wherein the test pattern is selected during the calibration routine;
a first delay circuit coupled to receive an output from the first multiplexer;
a second delay circuit coupled to receive an output from the second multiplexer;
a third delay circuit coupled to receive a clock signal; and
a control logic circuit to provide control data,
wherein the first, second, and third delay circuits each comprise:
a programmable delay line to delay a received signal;
a holding register to store the control data for the programmable delay line, wherein the control data adjusts the delay provided by the programmable delay line; and
a shift register having an input coupled to receive the control data from the control logic circuit, and to provide the control data to the holding register,
wherein the holding register holds a first set of control data while the shift register receives a second set of control data from the control logic circuit.

24. The integrated circuit of claim 23 further comprising a first flip-flop having a data input coupled to an output of the first delay circuit and a clock input coupled to an output of the third delay circuit, and a second flip-flop having a data input coupled to an output of the second delay circuit and a clock input coupled to an output of the third delay circuit.

25. The integrated circuit of claim 23 wherein each programmable delay line comprises a plurality of delay elements, each having an output coupled to a third multiplexer, wherein a select input for the third multiplexer is coupled to one or more flip-flops in the holding register.

26. The integrated circuit of claim 23 wherein the shift register comprises a first plurality of flip-flops coupled in series and the holding register comprises a second plurality of flip-flops, each flip-flop in the shift register having an output coupled to a flip-flop in the holding register.

27. The integrated circuit of claim 26 wherein each of the first plurality of flip-flops in the shift register is coupled to a multiplexer, each multiplexer having a first input coupled to receive an output from its flip-flop, and wherein the multiplexer for the first flip-flop has a second input coupled to receive the control data, and the multiplexers for the other flip-flops have a second input coupled to receive an output from a previous flip-flop.

* * * * *